(12) United States Patent
Pollard et al.

(10) Patent No.: US 7,338,611 B2
(45) Date of Patent: Mar. 4, 2008

(54) SLOTTED SUBSTRATES AND METHODS OF FORMING

(75) Inventors: Jeffrey R. Pollard, Corvallis, OR (US); Michael D. Miller, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 316 days.

(21) Appl. No.: 10/793,317

(22) Filed: Mar. 3, 2004

(65) Prior Publication Data

US 2005/0196885 A1   Sep. 8, 2005

(51) Int. Cl.
*G01D 15/00* (2006.01)
(52) U.S. Cl. ..................................... 216/27
(58) Field of Classification Search ............... 216/27, 216/56
See application file for complete search history.

(56) References Cited

U.S. PATENT DOCUMENTS

| | | | |
|---|---|---|---|
| 5,658,471 A * | 8/1997 | Murthy et al. ............... | 216/27 |
| 6,143,190 A | 11/2000 | Yagi et al. | |
| 6,629,756 B2 * | 10/2003 | Wang et al. ................. | 347/68 |
| 6,757,973 B2 * | 7/2004 | Park ............................ | 29/890.1 |
| 2003/0027426 A1 * | 2/2003 | Milligan et al. ............. | 438/700 |
| 2005/0011752 A1 * | 1/2005 | Yamazaki et al. ......... | 204/192.15 |

FOREIGN PATENT DOCUMENTS

| | | |
|---|---|---|
| EP | 1138491 | 10/2001 |
| WO | PCT/US2005/004988 | 5/2005 |

* cited by examiner

*Primary Examiner*—Parviz Hassanzadeh
*Assistant Examiner*—Maureen G Arancibia

(57) ABSTRACT

The described embodiments relate to slotted substrates and methods of forming same. One exemplary method forms a first slot portion into a first surface of a substrate, the first slot portion defining a footprint at the first surface. The method also forms a second slot portion through the first slot portion; and, forms a third slot portion through a second surface of the substrate sufficiently to intercept the second slot portion to form a fluid-handling slot through the substrate.

22 Claims, 8 Drawing Sheets

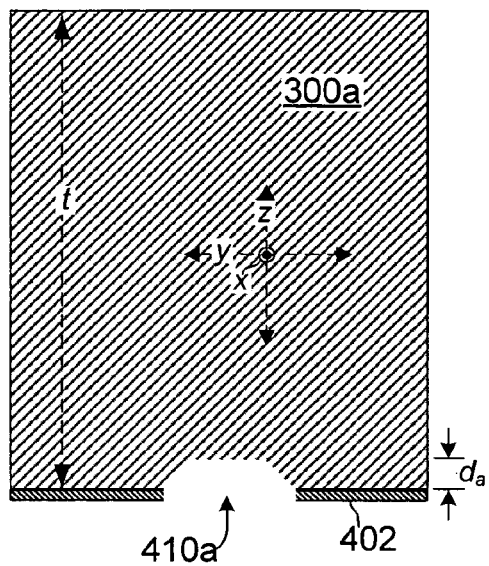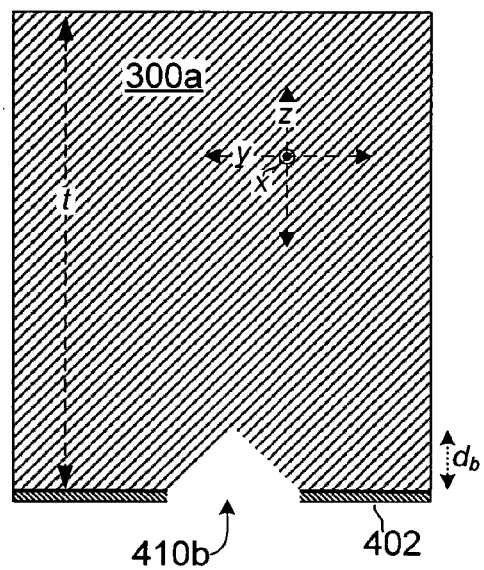
Fig. 4c     Fig. 4d
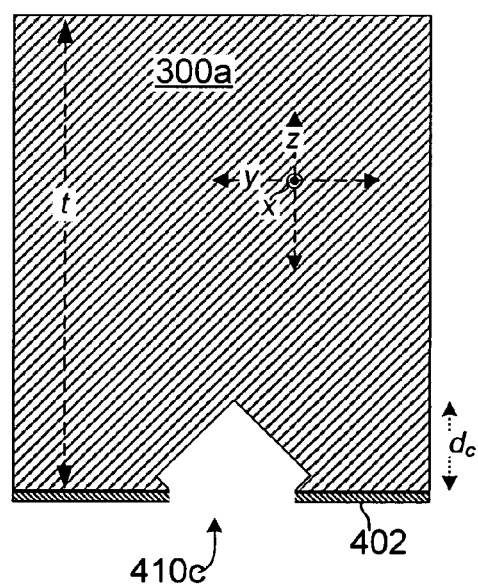
Fig. 4e

SLOTTED SUBSTRATES AND METHODS OF FORMING

BACKGROUND

Micro electro mechanical systems devices such as fluid-ejecting devices are employed in various capacities including print cartridges. Many micro electro mechanical systems devices utilize substrates having slots formed therein. Slots can be formed utilizing various suitable substrate removal techniques. Different substrate removal techniques have different attributes such as substrate removal rate, slot shapes which can be formed with the technique and controllability of the technique, among others. Improved slots and/or processing parameters can be achieved by utilizing a combination of substrate removal processing techniques to take advantage of these attributes.

BRIEF DESCRIPTION OF THE DRAWINGS

The same components are used throughout the drawings to reference like features and components wherever feasible. Alphabetic suffixes are utilized to designate different embodiments. The various components described below may not be illustrated to scale. Rather, the included figures are intended as diagrammatic representations to illustrate to the reader various inventive principles that are described herein.

DETAILED DESCRIPTION OF THE PREFERRED EMBODIMENTS

The embodiments described below pertain to methods and systems for forming slots in a substrate. Several embodiments are provided below where the slots comprise fluid-handling slots. Slots can also be in substrates utilized in many other applications.

Slots can be formed in three or more slot portions. Individual slot portions can be formed with a selected substrate removal process based upon characteristics of that particular slot portion. Substrate removal techniques can include, among others, etching, laser machining, abrasive jet machining, sawing, drilling and/or any combination thereof.

Exemplary Printing Device

Figure 1:
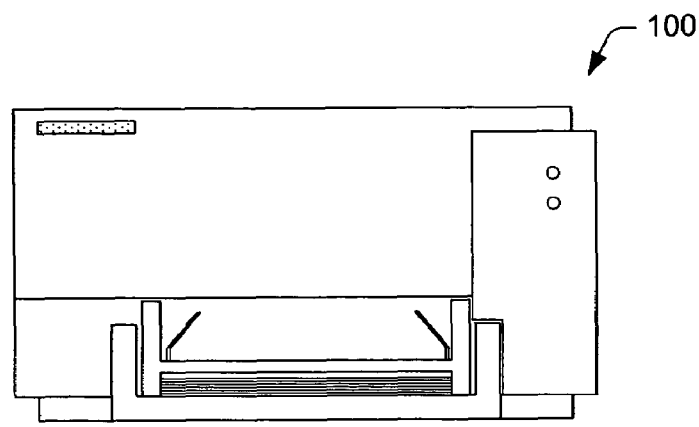
FIG. 1 illustrates a front elevational view of a diagrammatic representation of an exemplary printer in accordance with one embodiment.

FIG. 1 shows a diagrammatic representation of an exemplary printing device that can utilize an exemplary print cartridge. In this embodiment the printing device comprises a printer 100. The printer shown here is embodied in the form of an inkjet printer. The printer 100 can be capable of printing in black-and-white and/or color. The term "printing device" refers to any type of printing device and/or image forming device that employs slotted substrate(s) to achieve at least a portion of its functionality. Examples of such printing devices can include, but are not limited to, printers, facsimile machines, and photocopiers. In this exemplary printing device the slotted substrates comprise a portion of a print head which is incorporated into a print cartridge, an example of which is described below.

Beyond the printing arena, exemplary substrates having slots formed therein can be incorporated into various micro electro mechanical systems (MEMS) devices. Exemplary MEMS devices can comprise fluid-ejecting devices which are utilized in medical and laboratory applications among others. Exemplary substrates also can be utilized in various other applications. Other examples of exemplary MEMs devices can include display devices employing a slotted substrate to create a visual display.

Exemplary Products and Methods

Figure 2:
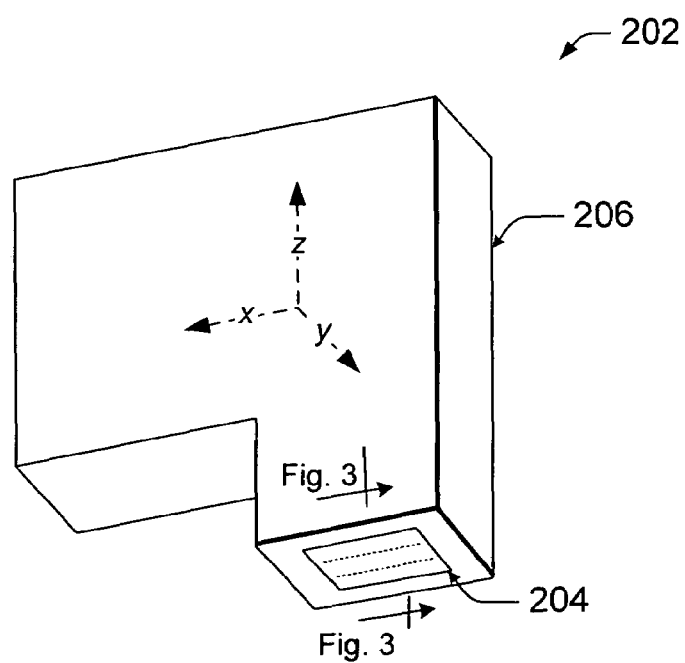
FIG. 2 illustrates a perspective view of a diagrammatic representation of a print cartridge suitable for use in the exemplary printer shown in FIG. 1 in accordance with one embodiment.

FIG. 2 shows a diagrammatic representation of an exemplary print cartridge 202 that can be utilized in an exemplary printing device. In this particular configuration the print cartridge is comprised of a print head 204 and a cartridge body 206 that supports the print head. Though a single print head 204 is employed on this print cartridge 202 other exemplary configurations may employ multiple print heads on a single cartridge.

Print cartridge 202 is configured to have a self-contained fluid or ink supply within cartridge body 206. Other print cartridge configurations may alternatively or additionally be configured to receive fluid from an external supply. Other exemplary configurations will be recognized by those of skill in the art.

Reliability of print cartridge 202 is desirable for proper functioning of printer 100. Further, failure of print cartridges during manufacture increases production costs. Reliability of print cartridges can be affected by contaminants interfering with or occluding proper fluid (ink) flow. One source of contaminants is debris created during the slotting process. As such, various embodiments described below can provide print heads with a reduced incidence of failure due to inadequate ink flow.

Figure 3:
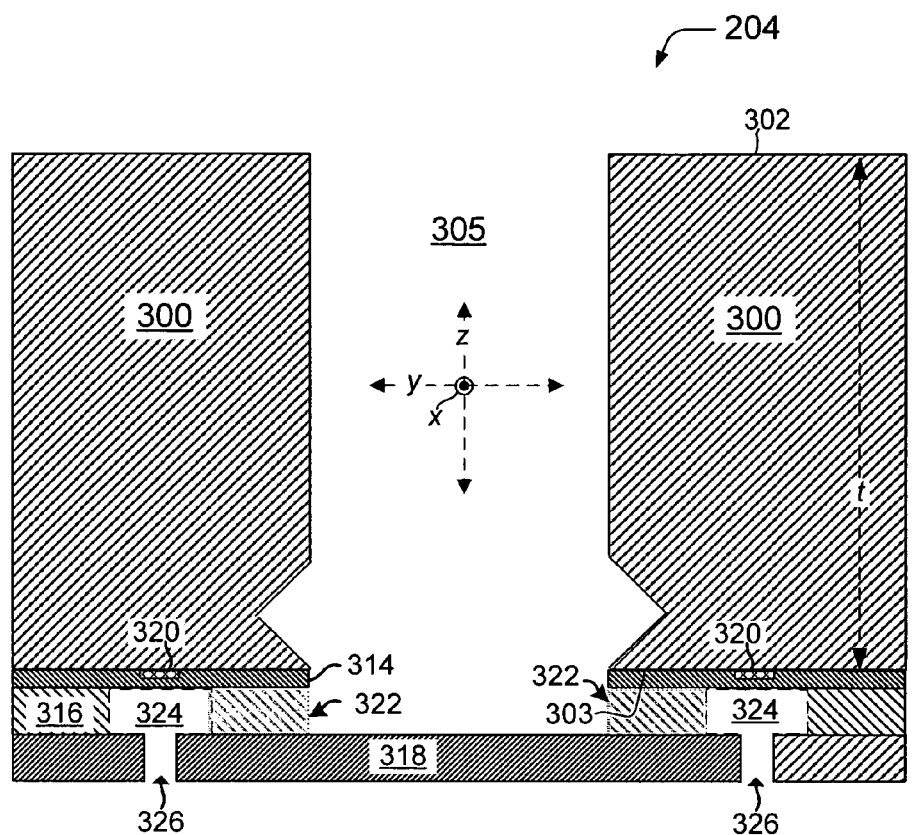
FIG. 3 illustrates a diagrammatic representation of a side-sectional view of a portion of the print cartridge shown in FIG. 2 in accordance with one embodiment.

FIG. 3 shows a side-sectional diagrammatic representation of a portion of the exemplary print head 204 as indicated in FIG. 2. The view of FIG. 3 is taken transverse an x-axis of a fluid-feed slot (described below), the axis extending into and out of the plane of the page upon which FIG. 3 appears. Here a substrate 300 has a thickness t which extends between a first substrate surface ("first surface") 302 and a second substrate surface ("second surface") 303.

In this embodiment a slot 305 passes through substrate 300 between first and second surfaces 302, 303. As will be described in more detail below, some slot formation techniques inadvertently can produce debris on the substrate material defining slot 305 and/or on the first and second surfaces 302, 303. Such debris can be carried by fluid into the finished print head and cause diminished performance. Some of the described embodiments can remove such debris.

In this particular embodiment, substrate 300 comprises silicon which either can be doped or undoped. Other substrate materials can include, but are not limited to, gallium arsenide, gallium phosphide, indium phosphide, glass, quartz or other material.

Substrate thickness t can have any suitable dimensions that are appropriate for an intended application. In some embodiments substrate thicknesses t can range from less than 100 microns to more than 2000 microns. One exemplary embodiment can utilize a substrate that is approximately 675 microns thick. Though a single substrate is discussed herein, other suitable embodiments may comprise a substrate that has multiple components during assembly and/or in the finished product. For example, one such embodiment may employ a substrate having a first component and a second sacrificial component which is discarded at some point during processing.

In this particular embodiment, one or more thin-film layers 314 are positioned over substrate's first surface 302. In at least some embodiments a barrier layer 316 and an orifice plate or orifice layer 318 are positioned over the thin-film layers 314.

In one embodiment one or more thin-film layers 314 can comprise one or more conductive traces (not shown) and electrical components such as resistors 320. Individual resistors can be controlled selectively via the electrical traces. Thin-film layers 314 also can define in some embodiments, at least in part, a wall or surface of multiple fluid-feed passageways 322 through which fluid can pass. Thin-film layers 314 can also comprise among others, a field or thermal oxide layer. Barrier layer 316 can define, at least in part, multiple firing chambers 324. In some embodiments fluid-feed passageways 322 may be defined in barrier layer 316, alone or in combination with thin-film layers 314. Orifice layer 318 can define multiple firing nozzles 326. Individual firing nozzles can be aligned respectively with individual firing chambers 324.

In operation a fluid, such as ink, can enter slot 305 from the cartridge body shown FIG. 2. Fluid then can flow through individual passageways 322 into an individual chamber 324. Fluid can be ejected from the chamber when an electrical current is passed through an individual resistor 320. The electrical current can heat the resistor sufficiently to heat some of the fluid contained in the firing chamber to its boiling point so that it expands to eject a portion of the fluid from a respectively positioned nozzle 326. The ejected fluid then can be replaced by additional fluid from passageway 322.

Figure 4A:
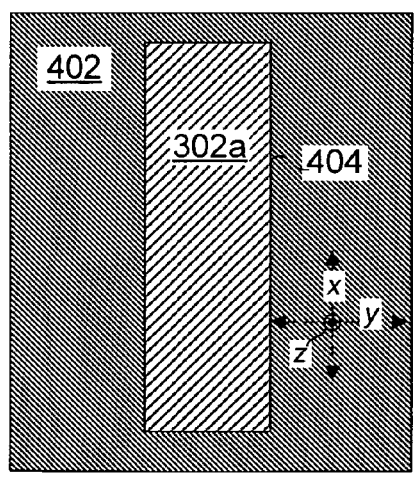
FIGS. 4a-4o illustrate diagrammatic representations of process steps for forming an exemplary slotted substrate in accordance with one embodiment.
Figure 4B:
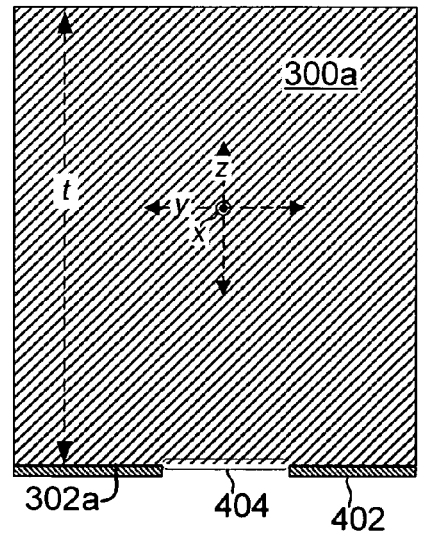
Figure 4F:
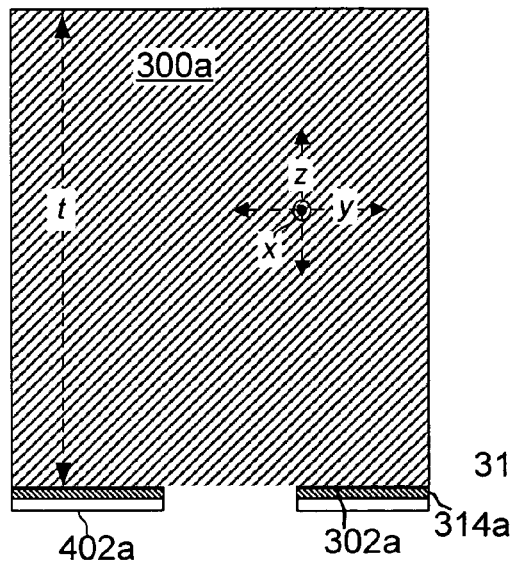
Figure 4G:
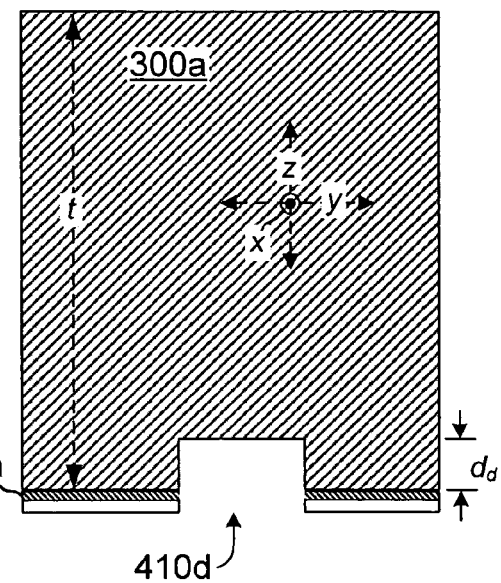
Figure 4H:
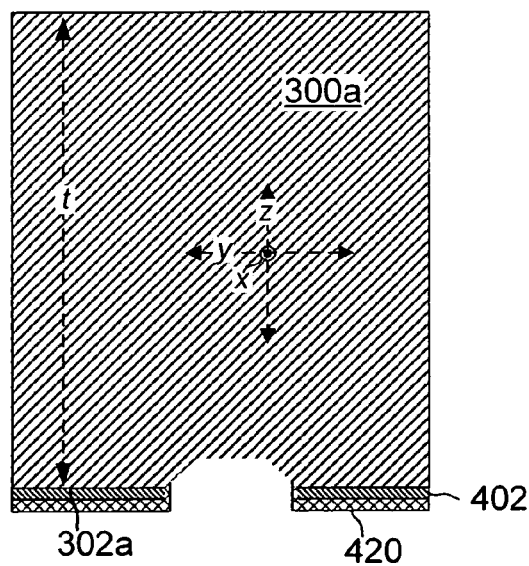
Figure 4I:
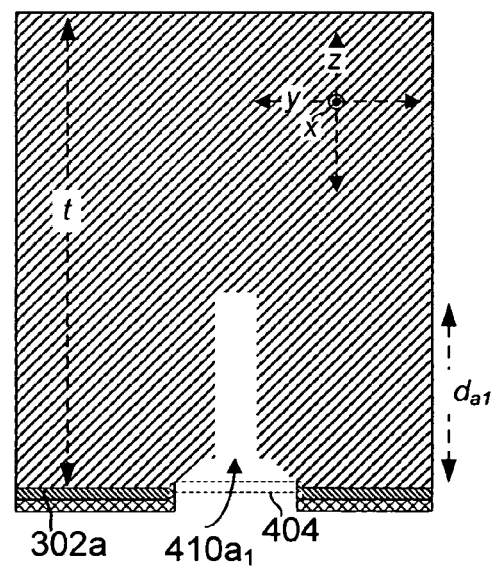
Figure 4J:
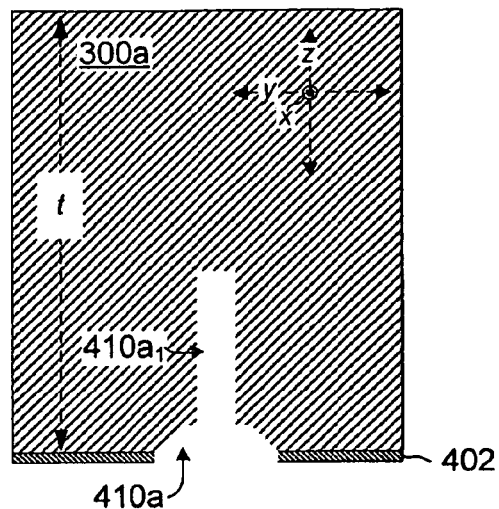
Figure 4K:
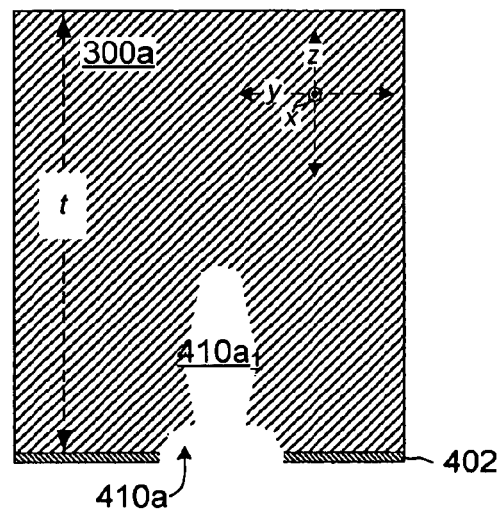
Figure 4L:
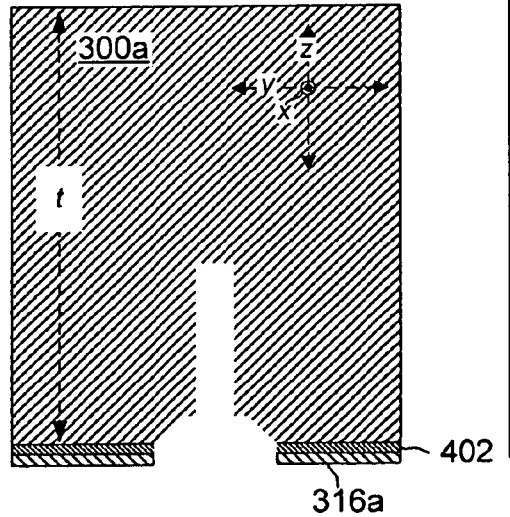
Figure 4M:
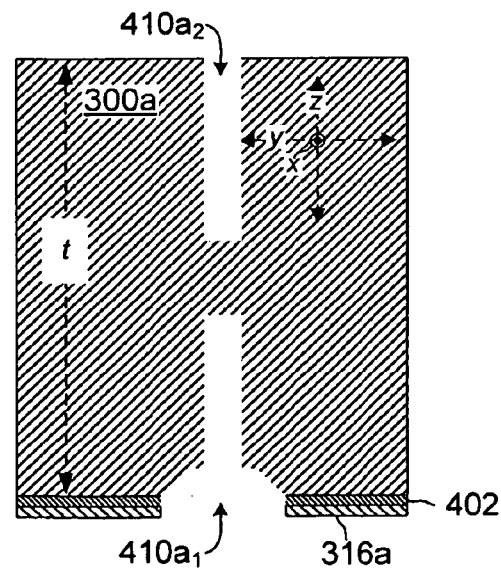
Figure 4N:
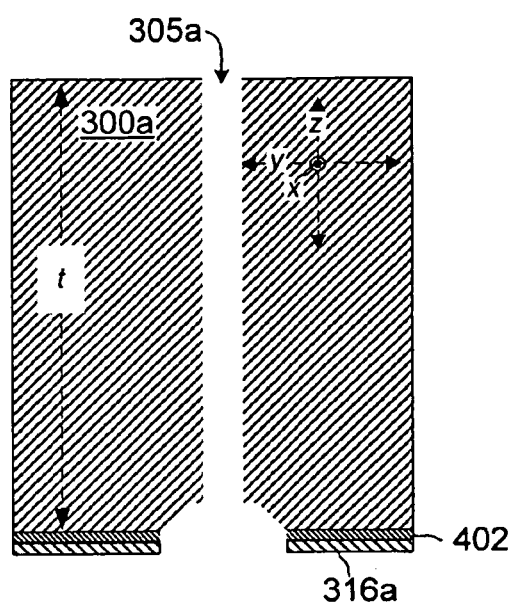
Figure 4O:
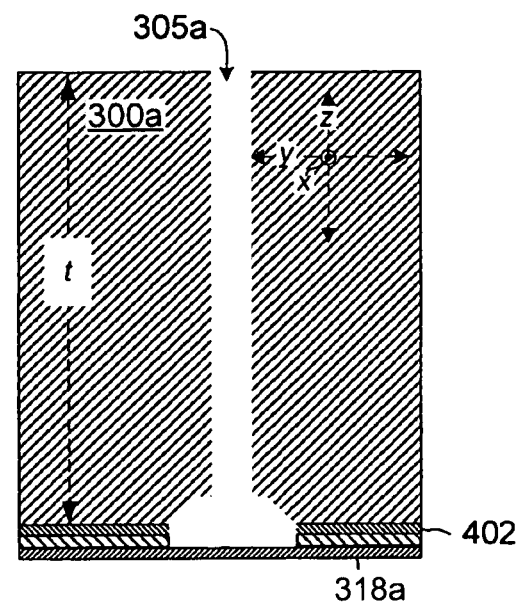

FIGS. 4a-4o illustrate diagrammatic representations of process steps for forming an exemplary slotted substrate in accordance with one embodiment. FIG. 4a illustrates a top view of substrate's first surface 302a. FIGS. 4b-4o illustrate side-sectional views of substrate 300a.

FIGS. 4a-4b illustrate an etch resistant layer 402 patterned over first surface 302a. Etch resistant layer 402 can be patterned to define a footprint 404. The footprint defines the maximum size and relative location of the slot which can be formed in substrate 300a in subsequent process steps. Examples of such processing steps are described below. In some embodiments etch resistant layer 402 can comprise one or more thin-film layers such as thin-film layers 314 described above in relation to FIG. 3.

Footprint 404 as illustrated in FIG. 4a generally approximates a rectangle. Other footprints may approximate an ellipse, square, circle or an irregular shape, among others.

Referring to FIGS. 4c-4e which illustrate a subsequent process step where an etchant acts upon substrate 300a. In this particular embodiment the etchant acts predominately upon exposed portions, e.g. those portions that are not covered by etch resistant layer 402, of substrate's first surface 302a. In this instance the exposed portion comprises footprint 404.

In the particular process illustrated in FIGS. 4c-4e different embodiments of a wet etchant acts upon first surface 302a to form first slot portions 410a-410c respectively. Examples of wet etchants can include potassium hydroxide and tetramethyl ammonium hydroxide among others.

FIGS. 4c-4e illustrate three examples of profiles of slot portions 410a-410c which can be formed in substrate 300a. Individual sub-portions extend to a first depth $d_a$-$d_c$ respectively, which may vary. Slot portions 410a-410c can illustrate examples of slot portion profiles which can be achieved with one exemplary removal process such as a wet etching process. The slot portion profiles can be affected by the etch conditions which include among others, the substrate's composition, the temperature of the etch environment, and the duration of the etch process. The skilled artisan should recognize other exemplary slot portion profiles may also be utilized.

FIGS. 4f-4g illustrate alternative processing steps where etch resistant layer 402a comprises a photo-resist and the etchant comprises a dry-etchant. Examples of photo-resists include SPR3625 among others. Examples of dry etchants can include $C_4F_8$ and $SF_6$ as utilized in the Bocsh process, among others. In some embodiments substrate's first surface 302a can be exposed to the etchant to form the slot portion. In some of these embodiments alternating acts of etching and passivating can be utilized to form a slot portion profile 410d to depth $d_d$ as illustrated in FIG. 4g among others. Other embodiments may utilize other anisotropic etching and/or isotropic etching processes to form an exemplary slot portion in substrate 300a. In this particular embodiment etch resistant layer 402a is positioned over thin-films 314a. Other exemplary embodiments may utilize other configurations such as positioning the etch resistant layer 402a in physical contact with substrate material comprising first surface 302a in the absence of any interposed layers.

The following process steps are described in relation to substrate 300a as depicted in FIG. 4c for purposes of explanation. The skilled artisan should recognize that the following process steps can be applicable to the other examples described above and/or other configurations.

Referring now to FIG. 4h where, in some embodiments, a protective coating 420 can be positioned over substrate's first surface 302a. The protective coating can protect the underlying material from debris and processing-related damage during subsequent processing steps. Various protective coatings are commercially available and should be recognized by the skilled artisan.

Referring to FIG. 4i where additional substrate material is removed through first surface 302a to form a second different slot portion $410a_1$. Removal of the additional substrate material forms second slot portion $410a_1$ to a second depth $d_{a1}$. In some embodiments such increased slot portion depth can be achieved while maintaining footprint 404 at the first surface 302a. Various exemplary removal processes can be utilized. Examples include, but are not limited to laser machining, dry etching, and abrasive jet machining.

As illustrated in FIG. 4j, protective layer 420 illustrated in FIG. 4i can be removed utilizing known processes. Some embodiments may alternatively or additionally expose the substrate to a wet etchant. In some embodiments the wet etchant can be utilized primarily to remove debris created during the proceeding removal processes and not primarily to increase the dimensions of second slot portion $410a_1$. Some suitable embodiments may etch without affecting the profile of the slot portions 410a, $410a_1$. In some other embodiments the etchant may affect the profile of the slot portions 410a, $410a_1$. Such an example is provided in FIG. 4k in comparison to the profiles illustrated in FIG. 4j. Whether this etch step affects the profile can be controlled among other factors by adjusting the etch solution and/or the duration of the etch process. In some embodiments exposing the substrate to a wet etchant may comprise washing the substrate with the wet etchant.

FIG. 4l illustrates a further process step where barrier layer 316a can be patterned over first surface 302a. Various known barrier layer materials can be utilized. In one particular implementation barrier layer 316a can comprise thick-film material, such as a photo-imagable polymer material. The photo-imagable polymer material can be applied in any suitable manner. For example, barrier layer 316a can be applied as a layer of material and then patterned to form firing chambers and fluid passageways as described in relation to FIG. 3.

Referring now to FIGS. 4m-4n where a further substrate removal process or processes can be utilized to remove substrate material through second surface 303a to form a third slot portion $410a_2$. Substrate material can be removed through the second surface sufficient to intercept second slot portion $410a_1$ to form a slot 305a through substrate 300a. Any suitable substrate removal technique can be utilized to remove material through the second surface.

Referring now to FIG. 4o where orifice layer 318a is positioned over first surface 302a to form print head 204 (FIG. 2). Orifice layer 318a can comprise an electroformed nickel or other suitable metal material in some embodiments. Alternatively orifice layer 318a can be a polymer, such as "KAPTON" or "Oriflex", with laser ablated nozzles. Other suitable embodiments may employ an orifice layer which performs the functions of both a barrier layer and an orifice layer.

Figure 5A:
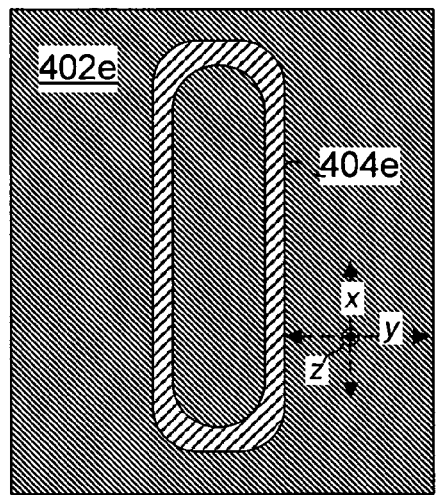
FIGS. 5a-5g illustrate diagrammatic representations of process steps for forming an exemplary slotted substrate in accordance with another embodiment.

FIGS. 5a-5f illustrate diagrammatic representations of process steps for forming another exemplary slotted substrate in accordance with one embodiment. FIG. 5a illustrates a top view of substrate's first surface 302e. FIGS. 5b-5f illustrate side-sectional views of substrate 300e.

Figure 5B:

FIGS. 5a-5b illustrate an etch resistant layer 402e patterned over first surface 302e to define a footprint 404e of a slot to be formed in substrate 300e. In this particular instance patterned layer 402e substantially approximates a "racetrack" shape which can define footprint 404e.

Figure 5C:
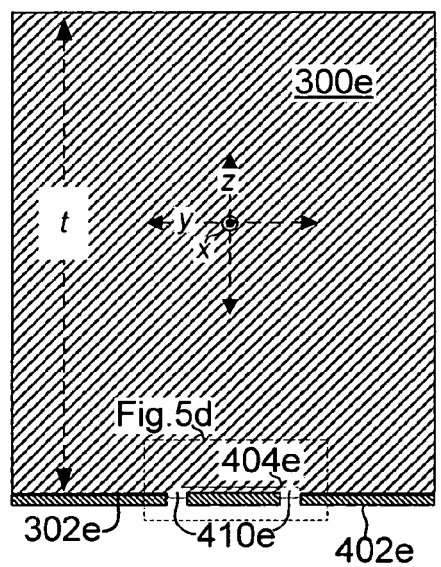
Figure 5D:
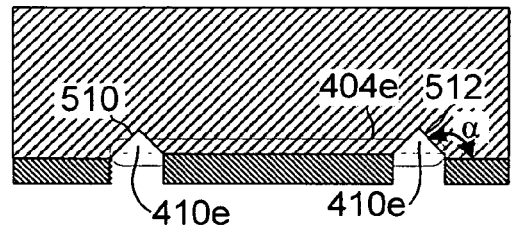

FIG. 5c-5d illustrate a further process step where a wet etchant removes substrate material to form a first slot portion 410e which defines footprint 404e. As indicated in FIG. 5c, FIG. 5d illustrates a portion of substrate 300e and first slot portion 410e in a little more detail. In this particular embodiment first slot portion 410e is defined, at least in part, by a sidewall portion that lies at an obtuse α angle relative to first surface 302e. Two sidewall portions 510 and 512 are indicated in FIG. 5d in relation to slot portion 410e.

Figure 5E:
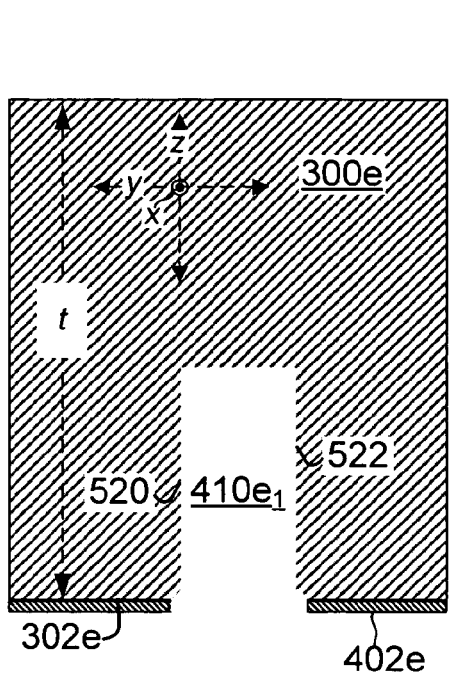

Referring now to FIG. 5e where additional substrate material is removed through first surface 302e to form a second different slot portion $410e_1$. In this embodiment second slot portion $410e_1$ is defined at least in part by a sidewall portion which lies generally orthogonal to first surface 302e. In this particular instance two sidewall portions 520, 522 which lie generally orthogonal to first surface 302e are designated. In this particular embodiment the outer perimeter of the racetrack represented as sidewall portions 510, 512 is maintained during this removal step. Other material lying within the outer perimeter can be removed with this removal step.

Figure 5F:
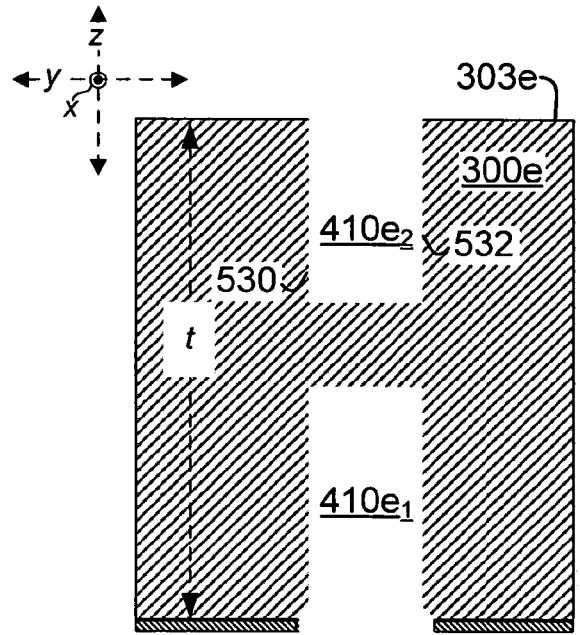
Figure 5G:
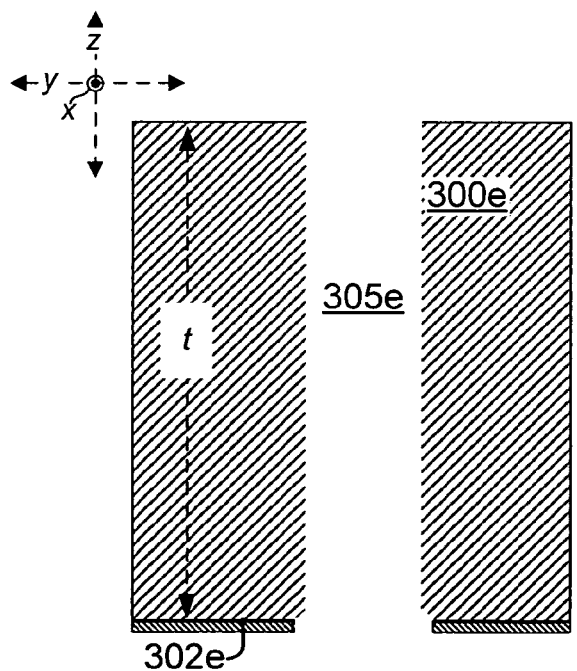

Referring now to FIGS. 5f-5g where a further substrate removal process removes substrate material through second surface 303e to form a third slot portion $410e_2$. Substrate material can be removed through the second surface sufficient to intercept second slot portion $410e_1$ to form a slot 305e through substrate 300e. In this embodiment third slot portion $410e_2$ is defined at least in part by a sidewall portion which lies generally orthogonal to first surface 302e. In this particular instance two sidewall portions 530, 532 which lie generally orthogonal to first surface 302e are designated.

The process steps described above can allow various substrate removal techniques to be combined to form a slotted substrate. Substrate removal techniques can be selected for their attributes related to forming a given slot portion or region of the slot. For example, etching through a patterned etch resistant layer can accurately form the footprint of the slot portion at the first surface. Etching can precisely determine the size of the slot portion and its relative distance from other components positioned on the first surface. This etching process can therefore be utilized to form the slot portion's footprint at the first surface but not relied upon to form the slot through a majority of the substrate's thickness t. A second removal process can be selected to remove substrate material primarily to increase slot portion depth in relation to substrate thickness while maintaining the footprint established by the first etching step. Many substrate removal processes decrease in efficiency as the slot portion depth becomes greater so a third substrate removal process can be utilized from the second surface to reduce the slot portion depth formed from a single side of the substrate. In embodiments where the first substrate removal process establishes the slot's footprint, the second and third substrate removal processes can be selected for attributes such as speed of substrate removal and the ability to form generally straight sidewalls among other factors.

Although specific structural features and methodological steps are described, it is to be understood that the inventive concepts defined in the appended claims are not necessarily limited to the specific features or steps described. Rather, the specific features and steps are disclosed as forms of implementation of the inventive concepts.

What is claimed is:

1. A method comprising:
   forming a first slot portion into a substrate, the first slot portion being formed into a first surface of the substrate and extending to a first depth that is less than a thickness of the substrate as defined between the first surface and a generally opposing second surface of the substrate, the first slot portion having an oval shape defining a footprint at the first surface of the substrate, the oval shape having an inner perimeter and an outer perimeter spaced from the inner perimeter defined in the first surface;
   removing additional substrate material through the first surface of the substrate to form a second slot portion to a second depth in the substrate, including maintaining the outer perimeter of the oval shape of the footprint at the first surface of the substrate and removing all substrate material within the outer perimeter of the oval shape to the second depth; and
   removing substrate material through the second surface of the substrate to at least the second slot portion to form a slot extending between the first surface and the second surface of the substrate.

2. The method of claim 1, wherein forming the first slot portion comprises etching.

3. The method of claim 1, wherein forming the first slot portion comprises anisotropically wet etching after patterning at least one etch resistant layer over the first surface.

4. The method of claim 1, wherein removing additional substrate material through the first surface comprises laser machining within the footprint.

5. The method of claim 1, wherein removing additional substrate material through the first surface comprises forming a protective layer over at least portions of the first surface and laser machining within the footprint.

6. The method of claim 5 further comprising, prior to removing substrate material through the second surface, removing the protective layer and exposing the substrate to an etchant, at least in part to remove debris.

7. The method of claim 6 further comprising, after exposing, positioning at least one barrier layer over the first surface.

8. The method of claim 7, wherein positioning at least one barrier layer occurs prior to said act of removing substrate material through the second surface.

9. The method of claim 7, wherein positioning at least one barrier layer comprises patterning the at least one barrier layer.

10. The method of claim 1, wherein removing additional substrate material comprises removing additional substrate material to form the second slot portion having at least one sidewall portion which lies generally orthogonal to the first surface.

11. A fluid handling slot forming method comprising:
patterning at least one etch resistant layer over a first surface of a substrate to define a location and a footprint of a first slot portion to be formed in the first surface of the substrate;
etching the first surface of the substrate to remove substrate material sufficient to etch the footprint into the first surface and form the first slot portion in the substrate, the footprint having an oval shape including an inner perimeter and an outer perimeter spaced from the inner perimeter defined in the first surface;
removing substrate material through the footprint to form a second slot portion in the substrate, including maintaining the outer perimeter of the oval shape of the footprint and removing all substrate material within the outer perimeter of the oval shape to a depth of the second slot portion; and,
removing substrate material through a second surface of the substrate to intercept the second slot portion to form a fluid-handling slot through the substrate.

12. The method of claim 11, wherein removing substrate material through the second surface defines sidewall portions that are generally orthogonal to the first surface.

13. A slot forming method comprising:
forming a first slot portion into a first surface of a substrate, the first slot portion defining a footprint having an oval shape including an inner perimeter and an outer perimeter at the first surface of the substrate, the outer perimeter spaced from the inner perimeter;
forming a second slot portion into the substrate through the first slot portion, including maintaining the outer perimeter of the oval shape of the footprint and removing all substrate material within the outer perimeter of the oval shape to a depth of the second slot portion; and,
forming a third slot portion into the substrate through a second surface of the substrate sufficiently to intercept the second slot portion to form a fluid-handling slot through the substrate while generally maintaining the outer perimeter of the footprint.

14. A method comprising:
removing material from a substrate through a first surface of the substrate to a first depth utilizing a first removal process, including forming a profile in the first surface of the substrate that is oval in shape and includes an inner perimeter and an outer perimeter at the first surface, the outer perimeter spaced from the inner perimeter;
removing additional substrate material through the first surface of the substrate to a second depth utilizing a second removal process different than the first removal process, including maintaining the outer perimeter of the oval shape of the profile and removing all substrate material within the outer perimeter of the oval shape to form a portion of a slot to the second depth; and
removing substrate material through a second surface of the substrate substantially opposing the first surface of the substrate to the portion of the slot, wherein by removing the substrate material through the second surface the slot is formed through the substrate.

15. The method of claim 14, wherein said first removal process comprises etching.

16. The method of claim 14, wherein said first removal process comprises anisotropically wet etching after patterning at least one etch resistant layer over the first surface.

17. The method of claim 14, wherein said second removal process comprises laser machining.

18. The method of claim 17, wherein said first removal process comprises forming a protective layer over at least portions of the first surface prior to laser machining.

19. The method of claim 17 further comprising, prior to removing substrate material through the second surface, removing the protective layer and exposing the substrate to an etchant, at least in part to remove debris.

20. The method of claim 14, wherein prior to removing substrate material through the second surface, the method comprises positioning at least one barrier layer over the first surface.

21. The method of claim 20, wherein positioning at least one barrier layer comprises patterning the at least one barrier layer.

22. The method of claim 14, wherein removing additional substrate material comprises removing additional substrate material so that at least one sidewall portion which lies generally orthogonal to the first surface is formed.

* * * * *